(12) United States Patent
Choi et al.

(10) Patent No.: US 11,094,756 B2
(45) Date of Patent: Aug. 17, 2021

(54) OLED INTEGRATED DIGITIZER AND METHOD OF PREPARING THE SAME

(71) Applicant: DONGWOO FINE-CHEM CO., LTD., Iksan-si (KR)

(72) Inventors: Byung Jin Choi, Siheung-si (KR); Minhyuk Park, Gangneung-si (KR); Seonghwan Park, Hwaseong-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 16/282,972

(22) Filed: Feb. 22, 2019

(65) Prior Publication Data

US 2019/0267430 A1     Aug. 29, 2019

(30) Foreign Application Priority Data

Feb. 23, 2018 (KR) .................. 10-2018-0021751

(51) Int. Cl.
| | |
|---|---|
| *H01L 27/32* | (2006.01) |
| *H01L 51/00* | (2006.01) |
| *G06F 3/041* | (2006.01) |
| *H01L 51/52* | (2006.01) |
| *G06F 3/044* | (2006.01) |
| *C09J 7/38* | (2018.01) |

(52) U.S. Cl.
CPC ............ *H01L 27/323* (2013.01); *C09J 7/38* (2018.01); *G06F 3/0412* (2013.01); *G06F 3/0445* (2019.05); *H01L 51/0097* (2013.01); *H01L 51/5246* (2013.01); *G06F 3/0446* (2019.05); *G06F 2203/04102* (2013.01); *G06F 2203/04103* (2013.01)

(58) Field of Classification Search
CPC .................................................. H01L 27/323
See application file for complete search history.

(56) References Cited

U.S. PATENT DOCUMENTS

| | | | | |
|---|---|---|---|---|
| 2007/0018969 | A1* | 1/2007 | Chen .................. | G06F 3/0412 345/173 |
| 2009/0004419 | A1* | 1/2009 | Cok ................... | G03F 1/92 428/40.1 |
| 2016/0043336 | A1* | 2/2016 | Kim .................. | H01L 27/323 257/40 |
| 2016/0093827 | A1* | 3/2016 | Han ................... | H01L 27/3246 257/40 |

FOREIGN PATENT DOCUMENTS

| | | |
|---|---|---|
| KR | 10-2012-0130990 A | 12/2012 |
| KR | 10-2015-0092817 A | 8/2015 |

* cited by examiner

*Primary Examiner* — Gustavo Polo
(74) *Attorney, Agent, or Firm* — Sughrue Mion, PLLC

(57) ABSTRACT

A digitizer module is formed on a film substrate which is used as a substrate of an OLED module and stacked with the OLED module, thereby providing an OLED integrated digitizer applicable to a flexible display device.

15 Claims, 6 Drawing Sheets

【Figure 1】
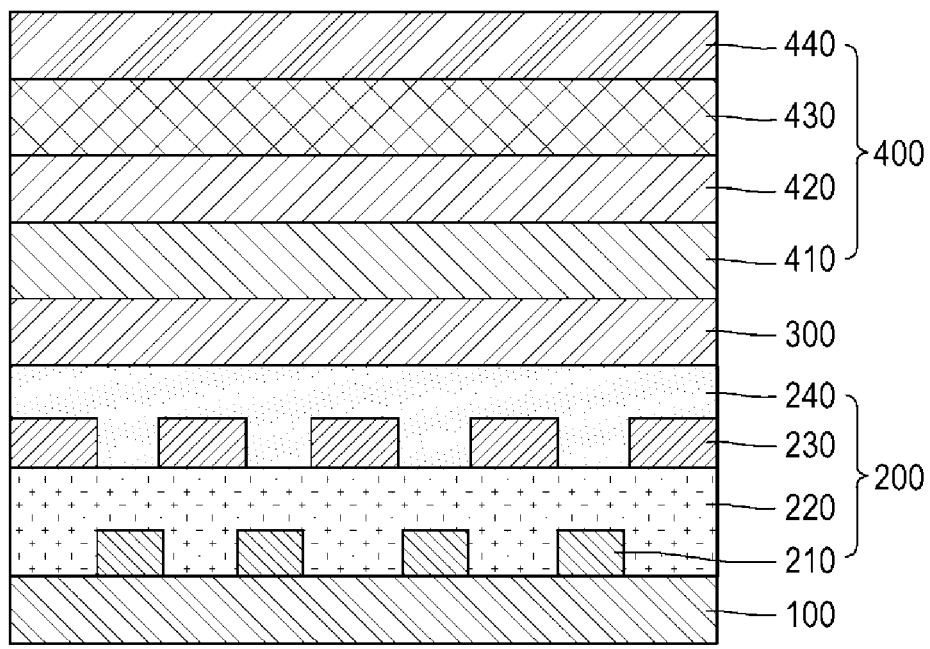
【Figure 2a】
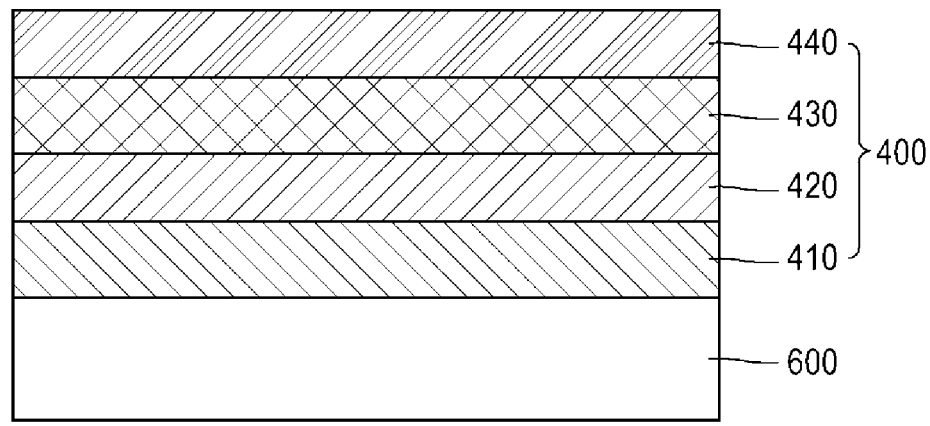

【Figure 2b】
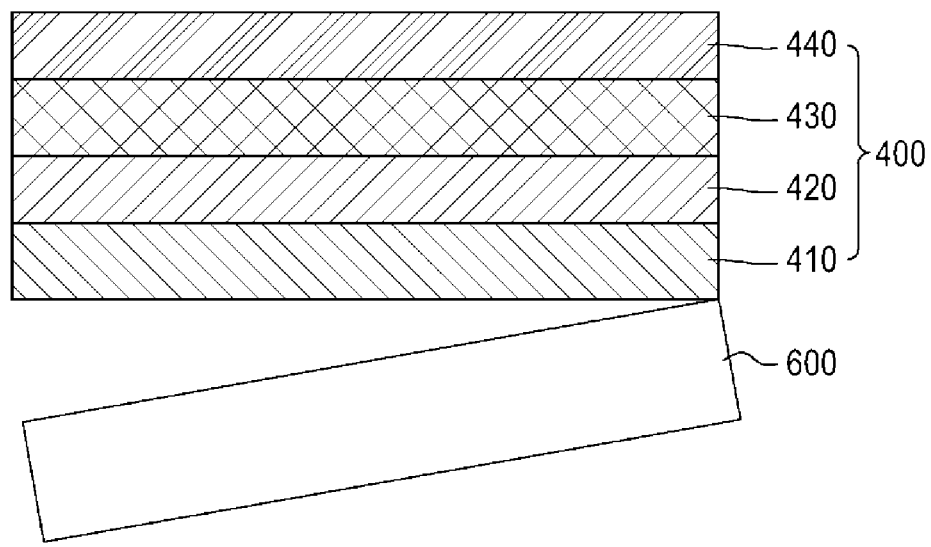
【Figure 2c】
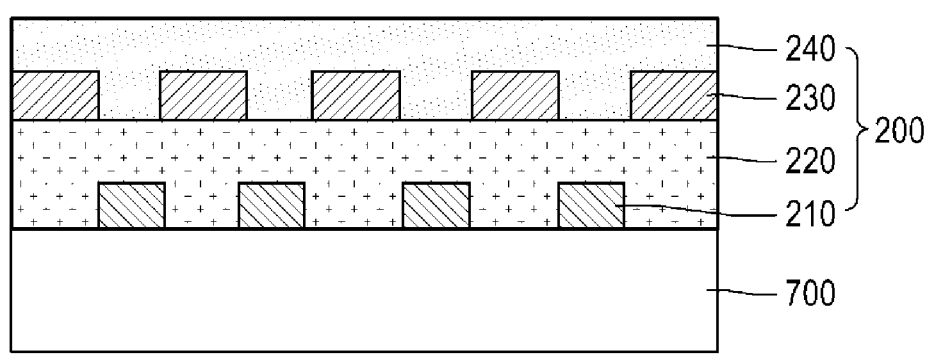

【Figure 2d】
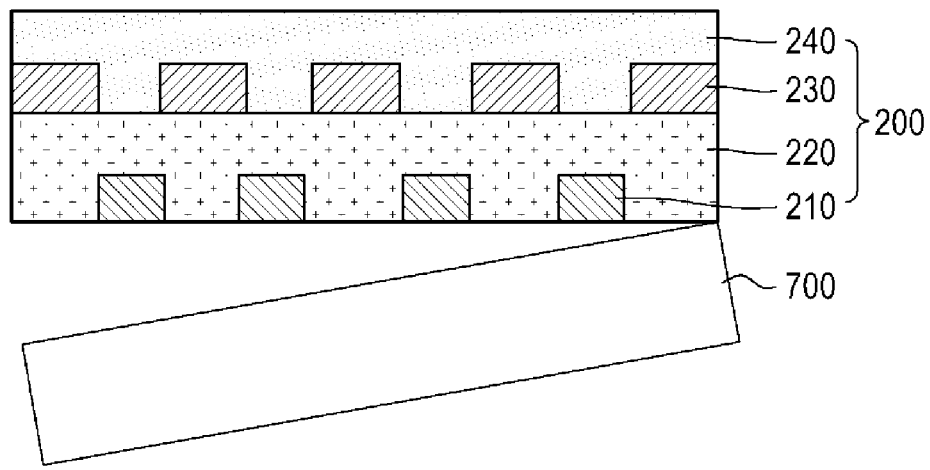
【Figure 2e】
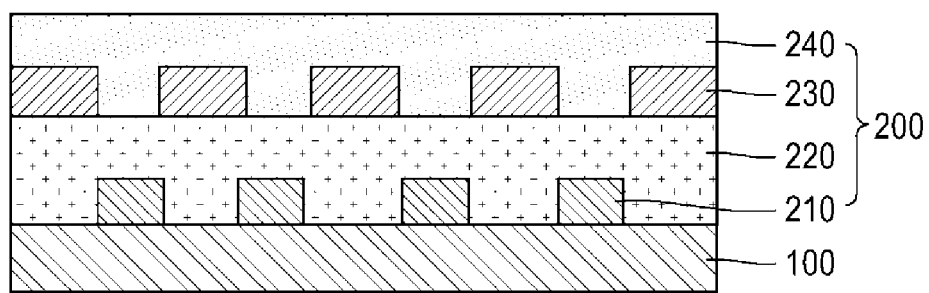
【Figure 2f】
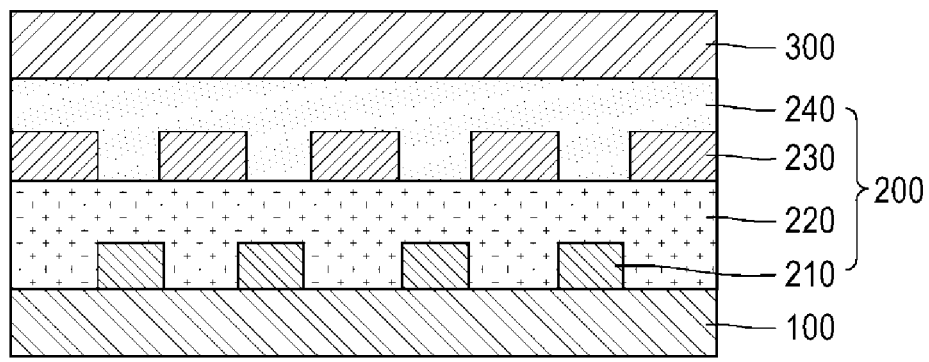

【Figure 2g】
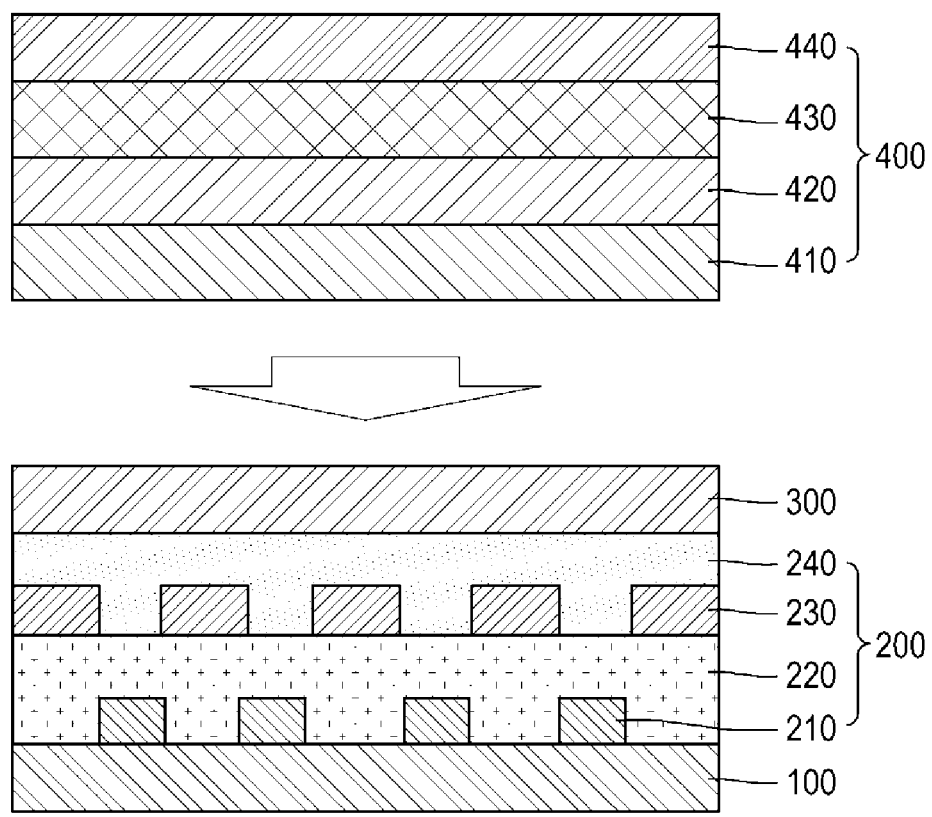

【Figure 3】
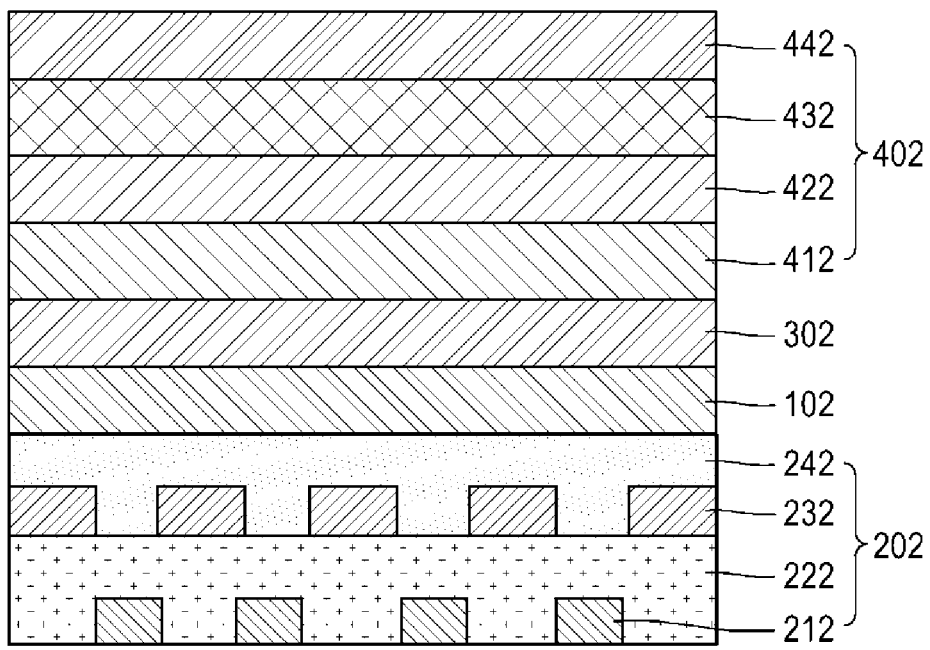
【Figure 4】
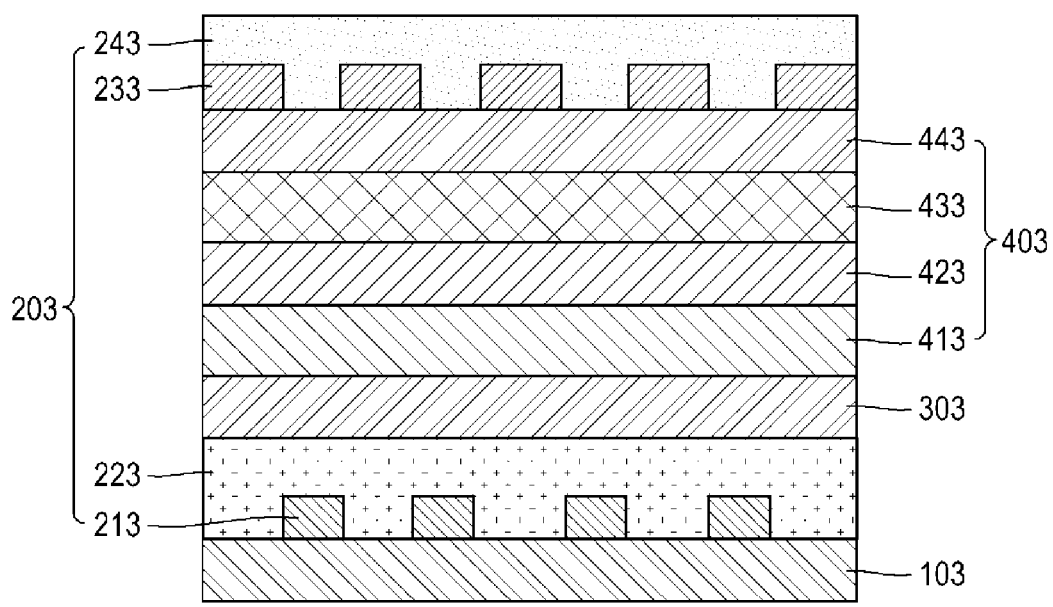

[Figure 5]
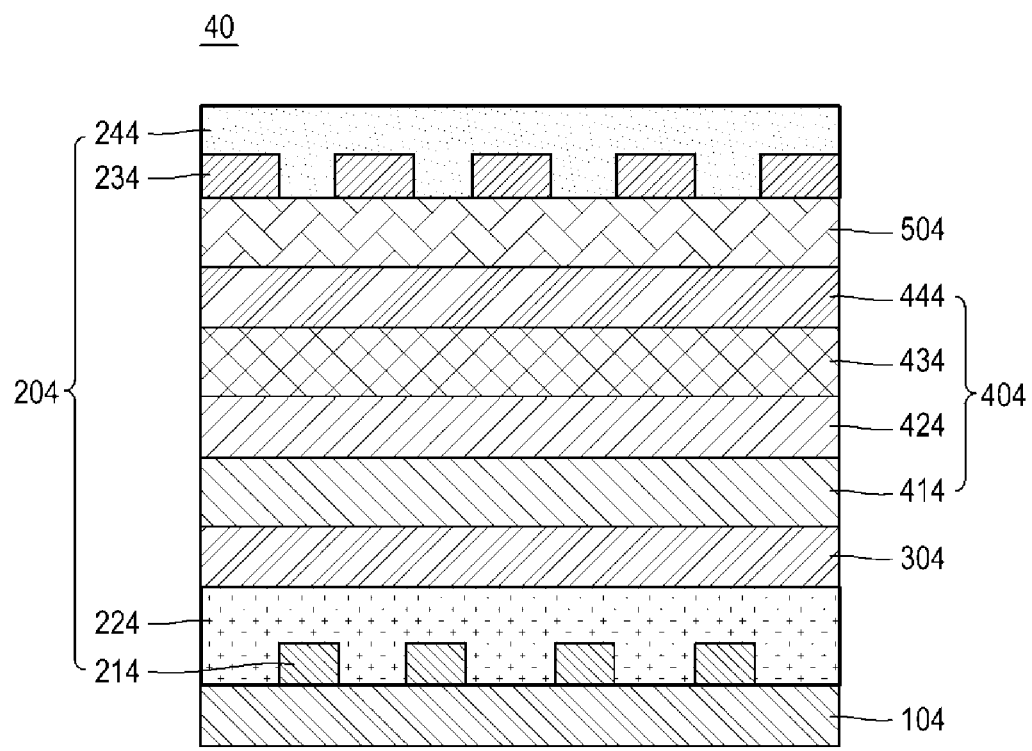

OLED INTEGRATED DIGITIZER AND METHOD OF PREPARING THE SAME

CROSS REFERENCE TO RELATED APPLICATIONS

This application claims priority based on Korean Patent Application No. 10-2018-0021751, filed Feb. 23, 2018, the entire content of which is incorporated herein by reference in its entirety.

TECHNICAL FIELD

The present invention relates to an OLED integrated digitizer and a preparation method thereof.

BACKGROUND ART

In recent display devices, a touch input method in which a user directly touches a screen using a finger or an electronic pen to input is widely used. In particular, such a touch input method can be combined with a display screen without a separate input device such as a keyboard or a mouse, and is thus widely used in portable terminals such as a smart phone, a notebook computer, and a tablet PC.

The touch input method can provide an intuitive and convenient user interface by allowing a user to directly touch a specific location of the display screen to input. In particular, since the touch input method using the pen is more accurate than the touch input method using the finger, it is also suitable for performing graphic work such as CAD.

A device used in such a touch input method for converting the coordinates of a pen into digital data is called a digitizer. Depending on the method of detecting the coordinates, there are a resistive method, a capacitive method, an electromagnetic resonance (EMR) method, and so on.

For example, Korean Patent Publication No. 10-2015-0092817 discloses a digitizer module comprising an EMR sensor substrate in which a plurality of loop coils are arranged; and a magnetic sheet disposed on a rear surface of the EMR sensor substrate and made of a magnetic material for inducing electromagnetic field formation of the EMR sensor substrate, wherein the EMR sensor substrate is an FPCB.

The digitizer module using the FPCB is advantageous in that it is easy to manufacture and handle. However, the digitizer module has disadvantages of high manufacturing cost and complicated structure. In addition, the digitizer module using FPCB has a large thickness of about 100 μm and has no bending resistance, which makes it difficult to apply to a flexible display device which is attracting attention as a next generation display device.

Korean Patent Publication No. 10-2012-0130990 discloses a digitizer integrated display comprising a thin film transistor substrate on which a thin film transistor and an organic light emitting layer are formed, and a sensor electrode of the digitizer formed on the opposite side of a surface of the thin film transistor substrate on which the thin film transistor is formed.

In this case, the thickness of the digitizer integrated display may be reduced to some extent. However, in order to form a thin film transistor and an organic light emitting layer on one surface of the thin film transistor substrate and to form a sensor electrode of the digitizer on the other surface, the process is complicated such as flipping the substrate, which results in an increase in cost or defects.

DISCLOSURE OF INVENTION

Technical Problem

It is an object of the present invention to provide an OLED integrated digitizer capable of reducing the thickness of the entire display device and a method of preparing the same.

Another object of the present invention is to provide an OLED integrated digitizer applicable to a flexible display device and a method of preparing the same.

Still another object of the present invention is to provide an OLED integrated digitizer which can be manufactured in a simplified process and at a low cost and a method of preparing the same.

Technical Solution

According to one aspect of the present invention, there is provided an OLED integrated digitizer, comprising: a flexible film substrate; a digitizer module arranged on the flexible film substrate; an adhesive layer on the digitizer module; and an OLED module arranged on the adhesive layer, the OLED module including a plastic substrate, a thin film transistor layer, an OLED layer and an encapsulation layer sequentially stacked.

According to another aspect of the present invention, there is provided an OLED integrated digitizer, comprising: a digitizer module; a flexible film substrate on the digitizer module; an adhesive layer on the flexible film substrate; and an OLED module arranged on the adhesive layer, the OLED module including a plastic substrate, a thin film transistor layer, an OLED layer and an encapsulation layer sequentially stacked.

According to yet another aspect of the present invention, there is provided an OLED integrated digitizer, comprising: a flexible film substrate; a transmitter digitizer electrode arranged on the flexible film substrate; a first passivation layer on the transmitter digitizer electrode; an adhesive layer on the first passivation layer; an OLED module arranged on the adhesive layer, the OLED module including a plastic substrate, a thin film transistor layer, an OLED layer and an encapsulation layer sequentially stacked; a receiver digitizer electrode on the OLED module; and a second passivation layer on the receiver digitizer electrode.

The OLED module may be prepared by forming the plastic substrate, the thin film transistor layer, the OLED layer and the encapsulation layer sequentially on a carrier substrate, separating the carrier substrate, and arranging the plastic substrate, the thin film transistor layer, the OLED layer and the encapsulation layer on the adhesive layer.

The plastic substrate may be made of polyimide.

The flexible film substrate may be made of polyethylene terephthalate.

The adhesive layer may be made of a pressure sensitive adhesive.

The OLED integrated digitizer may further comprise a shield layer arranged under the flexible film substrate or a shield layer arranged under the digitizer module.

The digitizer module may be prepared by forming a first digitizer electrode, an insulation layer, a second digitizer electrode and a passivation layer sequentially on a carrier substrate, separating the carrier substrate, and arranging the first digitizer electrode, the insulation layer, the second digitizer electrode and the passivation layer on the flexible film substrate, or the digitizer module may be prepared by forming directly on the flexible film substrate.

The OLED integrated digitizer may further comprise a touch sensor panel arranged between the OLED module and the receiver digitizer electrode.

Here, the receiver digitizer electrode may be formed on the touch sensor panel.

The receiver digitizer electrode may include a transparent conductive material.

According to still another aspect of the present invention, there is provided a method for preparing an OLED integrated digitizer, comprising the steps of: preparing an OLED module by forming a plastic substrate, a thin film transistor layer, an OLED layer and an encapsulation layer sequentially on a first carrier substrate and separating the first carrier substrate; forming a digitizer module arranged on a flexible film substrate; forming an adhesive layer on the digitizer module; and adhering the OLED module on the adhesive layer.

According to yet another aspect of the present invention, there is provided a method for preparing an OLED integrated digitizer, comprising the steps of: preparing an OLED module by forming a plastic substrate, a thin film transistor layer, an OLED layer and an encapsulation layer sequentially on a first carrier substrate and separating the first carrier substrate; forming a digitizer module on one side of a flexible film substrate; forming an adhesive layer on the other side of the flexible film substrate; and adhering the OLED module on the adhesive layer.

The step of forming the digitizer module may include: forming the digitizer module on a second carrier substrate; separating the second carrier substrate; and adhering the flexible film substrate on a surface from which the second carrier substrate is separated or on an opposite surface.

Advantageous Effects

According to the present invention, a part or all of a digitizer module is formed on a film substrate used as a substrate of an OLED module and stacked with the OLED module, thereby reducing a thickness and making it applicable to a flexible display device.

The OLED integrated digitizer of the present invention can reduce the number of laminating processes by forming a part or all of the digitizer module on the film substrate used as the substrate of the OLED module and stacking it with the OLED module, thereby shortening process time and reducing the cost.

DESCRIPTION OF DRAWINGS

FIG. 1 is a cross-sectional view of an OLED integrated digitizer according to the first embodiment of the present invention.

FIGS. 2a to 2g are cross-sectional views illustrating a method of preparing an OLED integrated digitizer according to the first embodiment of the present invention.

FIGS. 3 to 5 are cross-sectional views of OLED integrated digitizers according to the second to fourth embodiments of the present invention, respectively.

BEST MODE

Hereinafter, preferred embodiments of an OLED integrated digitizer and a method for preparing the same according to the present invention will be described in detail with reference to the accompanying drawings. However, the drawings accompanying the present disclosure are mere examples for describing the present invention, and the present invention is not limited by the drawings. Also, some elements may be exaggerated, scaled-down, or omitted in the drawing for clearer expressions.

In the present invention, there is provided an OLED integrated digitizer applicable to a flexible display device by forming a digitizer module on a film substrate which is used as a substrate of an OLED module and then stacking it with the OLED, module.

FIG. 1 is a cross-sectional view of an OLED integrated digitizer according to the first embodiment of the present invention.

Referring to FIG. 1, the OLED integrated digitizer 10 according to the first embodiment of the present invention comprises a film substrate 100, a digitizer module 200 on the film substrate 100, an OLED module 400 on the digitizer module 200, and an adhesive layer 300 between the digitizer module 200 and the OLED module 400.

The digitizer module 200 includes a first digitizer electrode 210, an insulation layer 220 on the first digitizer electrode 210, a second digitizer electrode 230 on the insulation layer 220, and a passivation layer 240 on the second digitizer electrode 230.

One of the first and second digitizer electrodes 210 and 230 may be used as a transmitter digitizer electrode, and the other may be used as a receiver digitizer electrode.

The first and second digitizer electrodes 210 and 230 may comprise a conductive material, and more specifically, the first and second digitizer electrodes 210 and 230 may be made of metal. Here, the metal may be any one of gold (Au), silver (Ag), copper (Cu), molybdenum (Mo), nickel (Ni), chromium (Cr), or silver-palladium-copper alloy (APC), but not limited thereto.

The first and second digitizer electrodes 210 and 230 may have a thickness from 2000 Å to 1 µm, respectively. If the thickness of the first and second digitizer electrodes 210 and 230 is less than 2000 Å, the sheet resistance may increase and the electrical characteristics may be deteriorated. If it is more than 1 µm, the flex resistance may be lowered.

It is more preferable that the first and second digitizer electrodes 210 and 230 have a thickness from 3000 Å to 8000 Å. When the thickness of the first and second digitizer electrodes 210 and 230 is between 3000 Å and 8000 Å, it can ensure enough flex resistance for not only bending but also folding, which is more suitable for a flexible display device.

Thicknesses of the first and second digitizer electrodes 210 and 230 may be equal to or different from each other.

The first and second digitizer electrodes 210 and 230 may be formed by deposition, in particular by sputtering. Using the sputtering method, the first and second digitizer electrodes 210 and 230 can be formed with a thinner thickness than in the case of forming using a metal foil as in a commercially available digitizer.

The insulation layer 220 may be formed of an organic insulation film or an inorganic insulation film.

As a material of the passivation layer 240, an insulation material known in the art may be used without limitation, and a non-metal oxide such as silicon oxide, a photosensitive resin composition including an acrylic resin or a thermosetting resin composition may be used.

The passivation layer 240 may be formed of, for example, a polycycloolefin-based material, and may have a thickness of 0.5 µm to 5 µm.

Also, the passivation layer 240 may be formed of, for example, an acryl-based organic insulation film material, and may have a thickness of 0.5 µm to 5 µm.

As the film substrate 100, a flexible film substrate can be used, and in particular, a film having excellent mechanical strength and thermal stability can be used.

Specific examples of the film substrate may include films made of thermoplastic resins, e.g., polyester resins such as polyethylene terephthalate, polyethylene isophthalate, polyethylene naphthalate and polybutylene terephthalate; cellulose resins such as diacetylcellulose and triacetylcellulose; polycarbonate resins; acrylate resins such as polymethyl (meth)acrylate and polyethyl (meth)acrylate; styrene resins such as polystyrene and acrylonitrile-styrene copolymer; polyolefin resins such as polyethylene, polypropylene, polyolefin having a cyclic or norbornene structure, and ethylene-propylene copolymer; vinyl chloride resins; amide resins such as nylon and aromatic polyamide; imide resins; polyethersulfone resins; sulfone resins; polyether ether ketone resins; polyphenylene sulfide resins; vinyl alcohol resins; vinylidene chloride resins; vinyl butyral resins; allylate resins; polyoxymethylene resins; and epoxy resins. Also, films made of a blend of the thermoplastic resins may be used. In addition, films made of thermally curable or UV curable resins such as (meth)acrylate, urethane, acrylic urethane, epoxy and silicon resins may be used.

Such a film substrate 100 may have a suitable thickness. For example, considering workability in terms of strength and handling, or thin layer property, the thickness of the film substrate 100 may range from 1 to 500 μm, preferably 1 to 300 μm, more preferably 5 to 200 μm.

The film substrate 100 may contain at least one suitable additive. Examples of the additive may include an UV absorber, an antioxidant, a lubricant, a plasticizer, a releasing agent, a coloring-preventing agent, an anti-flame agent, an anti-static agent, a pigment and a colorant. The film substrate 100 may comprise various functional layers including a hard coating layer, an anti-reflective layer and a gas barrier layer, but the present invention is not limited thereto. That is, other functional layers may also be included depending on the desired use.

If necessary, the film substrate 100 may be surface-treated. For example, the surface treatment may be carried out by drying method such as plasma, corona and primer treatment, or by chemical method such as alkali treatment including saponification.

The OLED module 400 includes a plastic substrate 410, a thin film transistor layer 420, an OLED layer 430, and an encapsulation layer 440.

For example, polyimide may be used for the plastic substrate 410, a low temperature polysilicon (LTPS) thin film transistor may be used for the thin film transistor layer 420, a top emission (TE) type OLED can be used for the OLED layer 430, and an organic film may be used for the encapsulation layer 440.

However, any flexible OLED module typically used in the art may be used without limitation as the OLED module 400 in the OLED integrated digitizer according to the first embodiment of the present invention, and the present invention is not limited to the specific constitution, materials and the like of it.

The adhesive layer 300 is a layer that adheres the digitizer module 200 and the OLED module 400 to each other and, for example, a pressure sensitive adhesive (PSA) may be used.

Although not shown in FIG. 1, the OLED integrated digitizer according to the first embodiment of the present invention may further include a shield layer under the film substrate 100.

Now, a method for preparing an OLED integrated digitizer according to the first embodiment of the present invention will be described in detail with reference to FIGS. 2a to 2g.

First, referring to FIG. 2a, a plastic substrate 410, a thin film transistor layer 420, an OLED layer 430, and an encapsulation layer 440 are sequentially formed on a glass substrate 600 as a carrier substrate.

As the plastic substrate 410, polyimide or the like can be used.

Next, as shown in FIG. 2b, the glass substrate 600 is separated from the OLED module 400.

Meanwhile, as shown in FIG. 2c, a first digitizer electrode 210, an insulation layer 220, a second digitizer electrode 230 and a passivation layer 240 are sequentially formed on another glass substrate 700 as a carrier substrate, and the glass substrate 700 is separated as shown in FIG. 2d.

After the glass substrate 700 is separated, a film substrate 100 is attached as shown in FIG. 2e.

As the film substrate 100, polyethylene terephthalate or the like can be used.

Now, as shown in FIG. 2f, an adhesive layer 300 is formed on the passivation layer 240.

Next, as shown in FIG. 2g, the OLED module 400 prepared through the process shown in FIGS. 2a and 2b is attached on the adhesive layer 300 to couple the OLED module 400 and the digitizer module 200 with each other.

Meanwhile, it is described that the OLED module 400 is formed first and then the digitizer module 200 is formed with reference to FIGS. 2a to 2e. However, the OLED module 400 and the digitizer module 200 may be formed independently of each other and are not bound by the order of their formation.

In addition, it is described that the digitizer module 200 is formed using a separate glass substrate 700, and the film substrate 100 is attached after removing the glass substrate 700 with reference to FIGS. 2c to 2e. However, the digitizer module 200 may be formed directly on the film substrate 100 without using the separate glass substrate 700.

Alternatively, a film substrate may be attached on top of a digitizer module instead of being attached to the bottom of the digitizer module.

FIG. 3 is a cross-sectional view of an OLED integrated digitizer according to the second embodiment of the present invention in which a film substrate is attached on top of a digitizer module.

Referring to FIG. 3, the OLED integrated digitizer 20 according to the second embodiment of the present invention comprises a digitizer module 202, a film substrate 102 on the digitizer module 202, an adhesive layer 302 on the film substrate 102, and an OLED module 402 on the adhesive layer 302.

Though it is not shown in FIG. 3, the OLED integrated digitizer according to the second embodiment of the present invention may further comprise a shield layer under the digitizer module 202.

Since the details of each component included in the OLED integrated digitizer 20 according to the second embodiment of the present invention are similar to those of the OLED integrated digitizer 10 according to the first embodiment of the present invention described with reference to FIG. 1, detailed description thereof is not repeated herein.

If the digitizer module 202 and the OLED module 402 are attached such that the film substrate 102 is arranged between the two modules, both modules will be located closer to the neutral plane of the film substrate 102 thereby reducing stress when bending or folding the flexible display device. Therefore, it becomes more suitable for use in a flexible display device.

Alternatively, a digitizer module may be divided into two sub-modules, which are disposed at the upper and lower portions of the OLED module, respectively.

FIG. 4 is a cross-sectional view of an OLED integrated digitizer according to the third embodiment of the present invention in which a digitizer module is divided into two sub-modules and a receiver module of the two sub-modules is disposed on top of an OLED module.

Referring to FIG. 4, the OLED integrated digitizer 30 according to the third embodiment of the present invention comprises a film substrate 103, a first digitizer electrode (transmitter digitizer electrode) 213 on the film substrate 103, a first passivation layer 223 on the first digitizer electrode 213, an adhesive layer 303 on the first passivation layer 223, an OLED module 403 on the adhesive layer 303, a second digitizer electrode (receiver digitizer electrode) 233 on the OLED module 403, and a second passivation layer 243 on the second digitizer electrode 233.

In the OLED integrated digitizer 30 according to the third embodiment of the present invention, the second digitizer electrode 233 is arranged over the OLED module 403 which is a display layer. Accordingly, it is preferable to use a transparent conductive material or to finely form an electrode pattern for the second digitizer electrode 233 so as not to be visually recognized.

In particular, the second digitizer electrode 233 may be formed of one or more materials selected from metal oxides, metal meshes, metal nanowires, carbon nanotubes, graphene, conductive polymers and conductive inks.

Alternatively, the second digitizer electrode 233 may have a stacked structure of at least two conductive layers, for example, a triple-layer structure of metal oxide/metal/metal oxide in order to reduce electrical resistance.

In the case of a triple-layer structure, the transmittance may be 75 to 92%.

When the triple-layer structure is used, the line width of the electrode is not particularly limited, and, for example, the second digitizer electrode 233 may have a line width of 10 to 500 μm. If the line width is less than 10 μm, the driving resistance is high so that the reaction speed may be slow or the sensitivity of the pen may be lowered.

In addition, a dummy pattern may be formed in an area where the second digitizer electrode 233 is not formed, thereby improving the visibility difference between the region where the pattern exists and the region where the pattern does not exist.

On the other hand, when the second digitizer electrode 233 is formed of metal, it is preferable to use a metal mesh, and the second digitizer electrode 233 may have a line width of 1 to 10 μm. When the line width of the second digitizer electrode 233 is 10 μm or less, even if the second digitizer electrode 233 is formed over the OLED module 403, the quality of the display can be secured because the second digitizer electrode 233 is not easily visible. However, if the line width is less than 1 μm, it may be difficult in the patterning process.

As the second digitizer electrode 233, which is a receiver digitizer electrode, is formed on the OLED module 403 as described above, the distance to the digitizer pen gets shorter, thereby improving the input sensing performance.

Meanwhile, a touch sensor panel (not shown in FIG. 4) for touch sensing may be arranged on the second passivation layer 243. If the touch sensor panel is arranged on the second passivation layer 243, the second digitizer electrode 233 and the second passivation layer 243 of the digitizer module 203 may be formed on the touch sensor panel.

Since the details of each component included in the OLED integrated digitizer 30 according to the third embodiment of the present invention are similar to those of the OLED integrated digitizer 10 according to the first embodiment of the present invention described with reference to FIG. 1, detailed description thereof is not repeated herein.

When a display device includes a touch sensor panel, a receiver module of a digitizer module may be arranged on top of the touch sensor panel.

FIG. 5 is a cross-sectional view of an OLED integrated digitizer according to the fourth embodiment of the present invention in which a receiver module of a digitizer module is arranged on top of the touch sensor panel positioned on an OLED module.

Referring to FIG. 5, the OLED integrated digitizer 40 according to the fourth embodiment of the present invention comprises a film substrate 104, a first digitizer electrode (transmitter digitizer electrode) 214 on the film substrate 104, a first passivation layer 224 on the first digitizer electrode 214, an adhesive layer 304 on the first passivation layer 224, an OLED module 404 on the adhesive layer 304, a touch sensor panel 504 on the OLED module 404, a second digitizer electrode (receiver digitizer electrode) 234 on the touch sensor panel 504, and a second passivation layer 244 on the second digitizer electrode 234.

When the second digitizer electrode 234 and the second passivation layer 244 are arranged on the touch sensor panel 504, the second digitizer electrode 234 and the second passivation layer 244 may be formed during the manufacturing process of the touch sensor panel 504.

In addition, the second digitizer electrode 234 which is the receiver digitizer electrode of the OLED integrated digitizer 40 according to the fourth embodiment of the present invention gets much closer to the digitizer pen, which further improves the input sensing performance.

Although particular embodiments and examples of the present invention have been shown and described, it will be understood by those skilled in the art that it is not intended to limit the present invention to the preferred embodiments, and it will be obvious to those skilled in the art that various changes and modifications may be made without departing from the spirit and scope of the invention.

The scope of the present invention, therefore, is to be defined by the appended claims and equivalents thereof.

| [Description of reference numerals] | |
|---|---|
| 10, 20, 30, 40: OLED Integrated Digitizer | |
| 100, 102, 103, 104: Film Substrate | 200, 202, 203, 204: Second Digitizer Module |
| 210, 212, 213, 214: First Digitizer Electrode | |
| 220, 222: Insulation Layer | 230, 232, 233, 234: Digitizer Electrode |
| 240, 242, 223, 243, 224, 244: Passivation Layer | |
| 300, 302, 303, 304: Adhesive Layer | 400, 402, 403, 404: OLED Module |
| 410, 412, 413, 414: Plastic Substrate | 420, 422, 423, 424: Thin Film Transistor Layer |
| 430, 432, 433, 434: OLED Layer | 440, 442, 443, 444: Encapsulation Layer |
| 504: Touch Sensor Panel | 600, 700: Glass Substrate |

The invention claimed is:

1. An organic light emitting diode (OLED) integrated digitizer, comprising:
   an OLED module including a plastic substrate, a thin film transistor layer, an OLED layer, and an encapsulation layer sequentially stacked;
   a digitizer module;
   a flexible film substrate disposed between the OLED module and the digitizer module; and
   an adhesive layer disposed between the OLED module and the flexible film substrate,
   wherein the digitizer module is prepared by forming a first digitizer electrode, an insulation layer, a second digitizer electrode, and a passivation layer sequentially on a carrier substrate, separating the carrier substrate, and arranging the first digitizer electrode, the insulation layer, the second digitizer electrode, and the passivation layer on the flexible film substrate.

2. The OLED integrated digitizer according to claim 1, wherein the OLED module is prepared by forming the plastic substrate, the thin film transistor layer, the OLED layer and the encapsulation layer sequentially on a carrier substrate, separating the carrier substrate, and arranging the plastic substrate, the thin film transistor layer, the OLED layer and the encapsulation layer on the adhesive layer.

3. The OLED integrated digitizer according to claim 1, wherein the plastic substrate is made of polyimide.

4. The OLED integrated digitizer according to claim 1, wherein the flexible film substrate is made of polyethylene terephthalate.

5. The OLED integrated digitizer according to claim 1, wherein the adhesive layer is made of a pressure sensitive adhesive.

6. The OLED integrated digitizer according to claim 1, further comprising a shield layer arranged under the flexible film substrate or under the digitizer module.

7. An organic light emitting diode (OLED) integrated digitizer, comprising:
   a flexible film substrate;
   a transmitter digitizer electrode arranged on top of the flexible film substrate;
   a first passivation layer arranged on top of the transmitter digitizer electrode;
   an adhesive layer arranged on top of the first passivation layer;
   an OLED module arranged on top of the adhesive layer, the OLED module including a plastic substrate, a thin film transistor layer, an OLED layer and an encapsulation layer sequentially stacked;
   a receiver digitizer electrode arranged on top of the OLED module; and
   a second passivation layer arranged on top of the receiver digitizer electrode.

8. The OLED integrated digitizer according to claim 7, further comprising a touch sensor panel arranged between the OLED module and the receiver digitizer electrode.

9. The OLED integrated digitizer according to claim 8, wherein the receiver digitizer electrode is formed on the touch sensor panel.

10. The OLED integrated digitizer according to claim 7, wherein the receiver digitizer electrode includes a transparent conductive material.

11. The OLED integrated digitizer according to claim 7, wherein the OLED module is prepared by forming the plastic substrate, the thin film transistor layer, the OLED layer and the encapsulation layer sequentially on a carrier substrate, separating the carrier substrate, and arranging the plastic substrate, the thin film transistor layer, the OLED layer and the encapsulation layer on the adhesive layer.

12. The OLED integrated digitizer according to claim 7, wherein the plastic substrate is made of polyimide.

13. The OLED integrated digitizer according to claim 7, wherein the flexible film substrate is made of polyethylene terephthalate.

14. The OLED integrated digitizer according to claim 7, wherein the adhesive layer is made of a pressure sensitive adhesive.

15. The OLED integrated digitizer according to claim 7, further comprising a shield layer arranged under the flexible film substrate.

* * * * *